US009947854B2

(12) United States Patent
Cho et al.

(10) Patent No.: US 9,947,854 B2
(45) Date of Patent: *Apr. 17, 2018

(54) THERMOELECTRIC MODULE, AND HEAT CONVERSION APPARATUS COMPRISING THE SAME

(71) Applicant: LG INNOTEK CO., LTD., Seoul (KR)

(72) Inventors: Yong Sang Cho, Seoul (KR); Sang Gon Kim, Seoul (KR); Sook Hyun Kim, Seoul (KR); Chae Hoon Kim, Seoul (KR); Myoung Lae Roh, Seoul (KR); Jong Bae Shin, Seoul (KR); Boone Won, Seoul (KR); Jong Min Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/913,220

(22) PCT Filed: Aug. 20, 2014

(86) PCT No.: PCT/KR2014/007735
§ 371 (c)(1),
(2) Date: Feb. 19, 2016

(87) PCT Pub. No.: WO2015/026159
PCT Pub. Date: Feb. 26, 2015

(65) Prior Publication Data
US 2016/0204329 A1    Jul. 14, 2016

(30) Foreign Application Priority Data
Aug. 20, 2013  (KR) .......... 10-2013-0098632

(51) Int. Cl.
| H01L 35/26 | (2006.01) |
| H01L 35/32 | (2006.01) |
| H01L 35/30 | (2006.01) |

(52) U.S. Cl.
CPC ............ *H01L 35/325* (2013.01); *H01L 35/30* (2013.01); *H01L 35/32* (2013.01)

(58) Field of Classification Search
CPC ........ H01L 35/32; H01L 35/325; H01L 35/30
(Continued)

(56) References Cited

U.S. PATENT DOCUMENTS

| 2009/0084421 A1 | 4/2009 | Olsen et al. |
| 2012/0145209 A1 | 6/2012 | Kim et al. |
| 2014/0190543 A1* | 7/2014 | Chen ............... H01L 35/325 |
| | | 136/224 |

FOREIGN PATENT DOCUMENTS

| EP | 2 381 498 | 10/2011 |
| EP | 2 894 682 | 7/2015 |

(Continued)

OTHER PUBLICATIONS

International Search Report (with English translation) and Written Opinion dated Nov. 27, 2014 issued in Application No. PCT/KR2014/007735.

(Continued)

*Primary Examiner* — Jayne Mershon
(74) *Attorney, Agent, or Firm* — KED & Associates, LLP

(57) ABSTRACT

The embodiments of the present invention relate to a thermoelectric element and a thermoelectric module used for cooling, and the thermoelectric module can be made thin by having a first substrate and a second substrate with different surface areas to raise the heat-dissipation effectiveness.

12 Claims, 6 Drawing Sheets

(58) Field of Classification Search
USPC .......................................................... 136/212
See application file for complete search history.

(56) References Cited

FOREIGN PATENT DOCUMENTS

| | | |
|---|---|---|
| JP | 2009-164498 | 7/2009 |
| KR | 10-2007-0081441 A | 8/2007 |
| KR | 10-2010-0003494 A | 1/2010 |
| KR | 10-2011-0117872 A | 10/2011 |
| KR | 10-2012-0011626 A | 2/2012 |
| KR | 10-2012-0064517 A | 6/2012 |

OTHER PUBLICATIONS

European Search Report dated Feb. 24, 2017 issued in Application No. 14837852.4.

* cited by examiner (a)

(b)

(c)

THERMOELECTRIC MODULE, AND HEAT CONVERSION APPARATUS COMPRISING THE SAME

CROSS-REFERENCE TO RELATED PATENT APPLICATIONS

This application is a U.S. National Stage Application under 35 U.S.C. § 371 of PCT Application No. PCT/KR2014/007735, filed Aug. 20, 2014, which claims priority to Korean Patent Application No. 10-2013-0098632, filed Aug. 20, 2013, whose entire disclosures are hereby incorporated by reference.

TECHNICAL FIELD

Embodiments of the present invention relate to a thermoelectric module used for cooling.

BACKGROUND ART

A method of manufacturing a thermoelectric element includes thermal-processing an ingot type material, ball-milling the thermal-processed material to a powder, sieving the powder to a fine sized powder, sintering the fine sized powder again, and cutting the sintered powder to a required size of thermoelectric element. In such a manufacturing process of a bulk-type thermoelectric element, there is a difficult problem in applying it to a product that requires slimness due to a large portion of material loss occurring during the cutting after sintering the powder, a decrease in uniformity in terms of size of a bulk material in mass production, and difficulty in thinning a thickness of the thermoelectric element.

Particularly, in the case of the thermoelectric module using such a conventional thermoelectric element, devices of a heat sink, a fan, and the like have to be installed thereunder, which causes a sudden increase in the size and thickness thereof, thereby incurring a problem of a space constraint when being applied to an actual product.

DISCLOSURE

Technical Problem

The present invention is directed to providing a thermoelectric module capable of implementing thinning of the thermoelectric module by forming a first substrate and a second substrate to have areas different from each other to increase heat-dissipation efficiency. Particularly, when forming the first substrate and the second substrate to have areas different from each other, a substrate area of a heat-dissipation side is largely formed so that a heat transfer rate is increased, thereby a heat sink is removed and a thermoelectric module capable of implementing miniaturization and thinning of a cooling device may be provided.

Technical Solution

One aspect of the present invention provides a thermoelectric module which includes a first substrate and a second substrate facing each other, and at least one unit cell including a first semiconductor element and a second semiconductor element which are electrically connected and interposed between the first substrate and the second substrate, wherein areas of the first substrate and the second substrate are different from each other.

Advantageous Effects

According to the embodiment of the present invention, thinning of a thermoelectric module can be implemented by forming a first substrate and a second substrate to have areas different from each other to increase heat-dissipation efficiency.

Particularly, when forming the first substrate and the second substrate to have areas different from each other, a substrate area of a heat dissipation side is largely formed so that a heat transfer rate is increased, thereby a heat sink is removed and it is advantageous to provide a thermoelectric module capable of implementing miniaturization and thinning of a cooling device.

Further, according to the embodiment of the present invention, since a thermoelectric element is implemented by stacking unit members having a semiconductor layer on a sheet type base material, a thermal conductivity is lowered and an electric conductivity is increased, and thus a thermoelectric element and a thermoelectric module having a significant improvement in cooling capacity (Qc) and temperature change rate ($\Delta T$) can be provided.

In addition, a conductive pattern layer can be included in between each unit member in a stacked structure to maximize the electric conductivity, which is effective in achieving significantly thinner thickness compared to that of a pure bulk-type thermoelectric element.

REFERENCE NUMERALS

Figure 1:
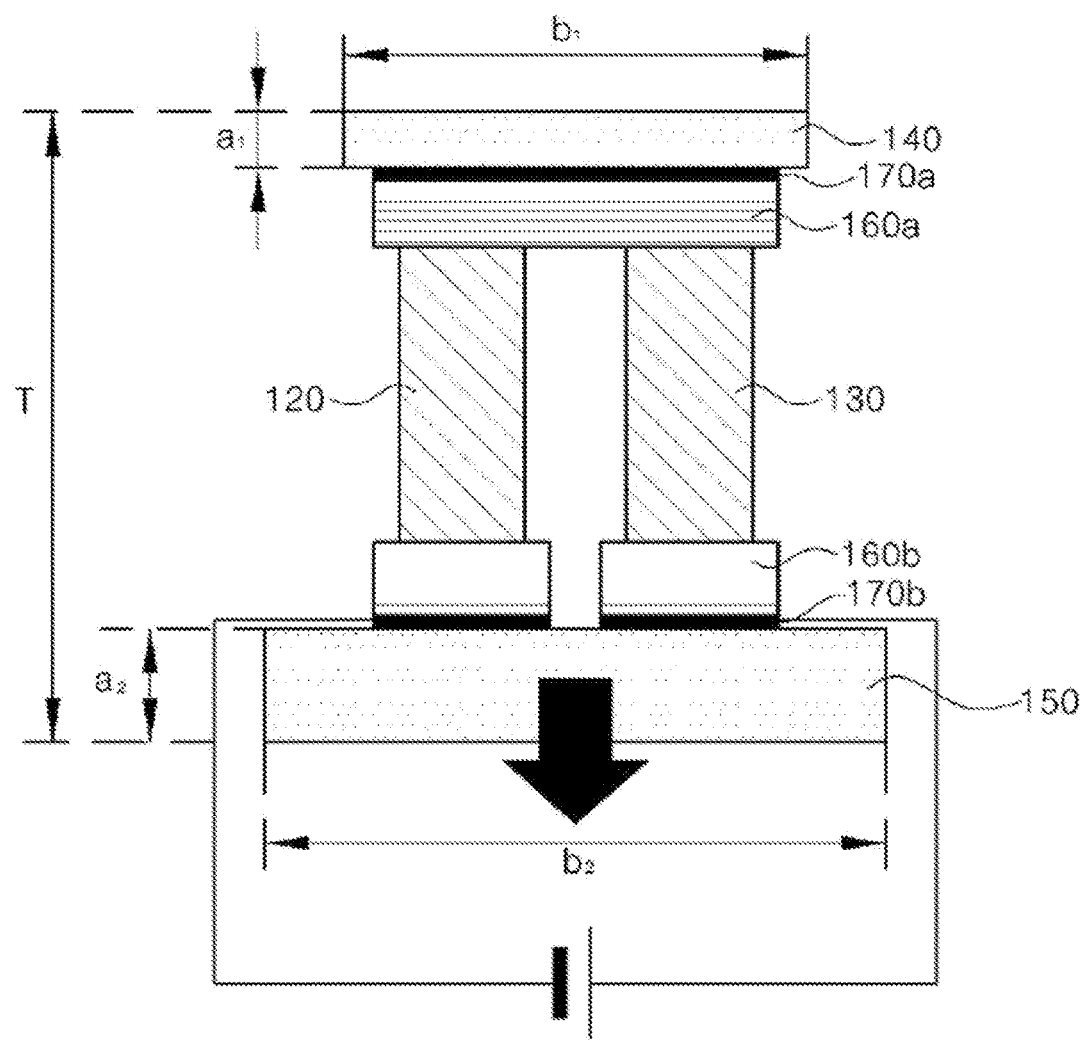
FIG. 1 is a conceptual diagram of a main portion of a thermoelectric module in accordance with an embodiment of the present invention.

110: Unit Member
111: Base Material
112: Semiconductor Layer
120: Thermoelectric Element Unit
130: Thermoelectric Element Unit
140: First Substrate
150: Second Substrate
160a, 160b: Electrode Layer
170A, 170B: Dielectric Layer
181, 182: Circuit Line

MODES OF THE INVENTION

Hereinafter, configurations and operations according to the present invention will be described in detail with reference to the accompanying drawings. In the description with reference to the accompanying drawings, like elements are designated by the same reference numerals regardless of drawing numbers, and duplicated descriptions thereof will be omitted. Although the terms "first," "second," etc. may be used herein to describe various elements, these elements should not be limited by these terms. These terms are only used to distinguish one element from another.

Figure 2:
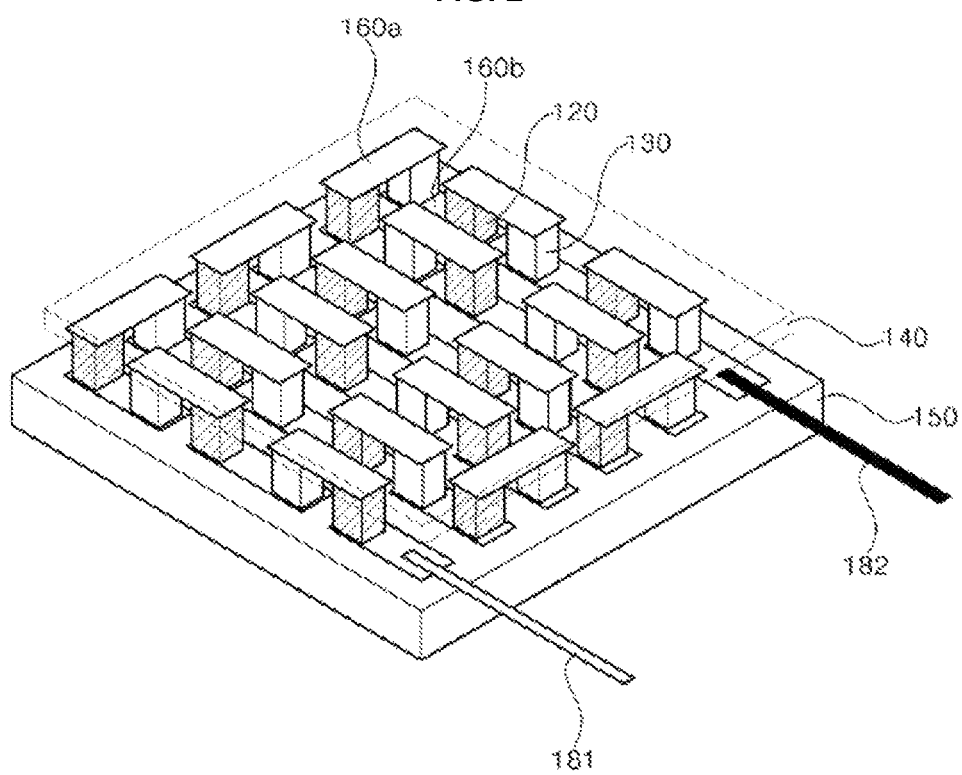
FIG. 2 is a view showing an implementation sample of the thermoelectric module in accordance with the embodiment of the present invention.

FIG. 1 is a conceptual diagram of a main portion of a thermoelectric module in accordance with an embodiment of the present invention, and FIG. 2 is an illustration showing an implementation sample of the thermoelectric module in accordance with the embodiment of the present invention applying the thermoelectric module of FIG. 1.

Referring to FIGS. 1 and 2, the thermoelectric module in accordance with an embodiment of the present invention includes a first substrate 140 and a second substrate 150 facing each other, and at least one unit cell including a first semiconductor element 120 and a second semiconductor element 130 which are electrically connected and interposed between the first substrate 140 and the second substrate 150. Particularly, the first substrate and the second substrate may be formed to have volumes different from each other. The term 'Volume' in the embodiment of the present invention is defined as an internal volume formed by an outer circumference surface of a substrate.

In this case, a thermoelectric element forming a unit cell may be constituted by a P-type semiconductor as the first semiconductor element 120 at one side and an N-type semiconductor as the second semiconductor element 130 at the other side, and the first semiconductor element and the second semiconductor element are connected to metal electrodes 160a and 160b, and a plurality of such structures are formed, thereby implementing a Peltier effect by circuit lines 181 and 182 which supply current to the semiconductor elements via the electrode.

Particularly, in the present invention, by forming an area of the second substrate 150 serving as a hot side to be wider than an area of the first substrate 140 serving as a cold side to increase a thermal conductivity and heat-dissipation efficiency, a heat sink of a conventional thermoelectric module may be removed.

Specifically, a conventional insulation substrate, such as an alumina substrate, may be used for the first substrate 140 and the second substrate 150 in the case of the thermoelectric module for cooling, or in the case of the embodiment of the present invention, a metal substrate may be used to implement heat-dissipation efficiency and thinning. As a matter of course, when forming using the metal substrate, as illustrated, it is preferable that dielectric layers 170a and 170b be further included and formed between the electrode layers 160a and 160b which are formed on the first substrate 140 and the second substrate 150.

In the case of the metal substrate, Cu, a Cu alloy, a Cu—Al alloy or the like may be applied, and a thickness capable of thinning may be formed in the range of 0.1 mm to 0.5 mm.

In accordance with the embodiment of the present invention, volumes may be formed to differ from each other by forming the area of the second substrate 150 to be in the range of 1.2 to 5 times the area of the first substrate 140. Even in the view illustrated in FIG. 1, a width b1 of the first substrate 140 is formed to be smaller than a width b2 of the second substrate 150, and in this case, areas of the substrates having the same thickness are formed to be different from each other resulting in different volumes.

When the area of the second substrate 150 is formed to be less than 1.2 times that of the first substrate 140, thinning becomes meaningless because of a little difference from conventional heat transfer efficiency, whereas, when the area of the second substrate 150 is more than 5 times that of the first substrate 140, heat transfer efficiency drops remarkably because of difficulty in maintaining the shape of the thermoelectric module, i.e., a facing structure of facing each other.

Figure 3:
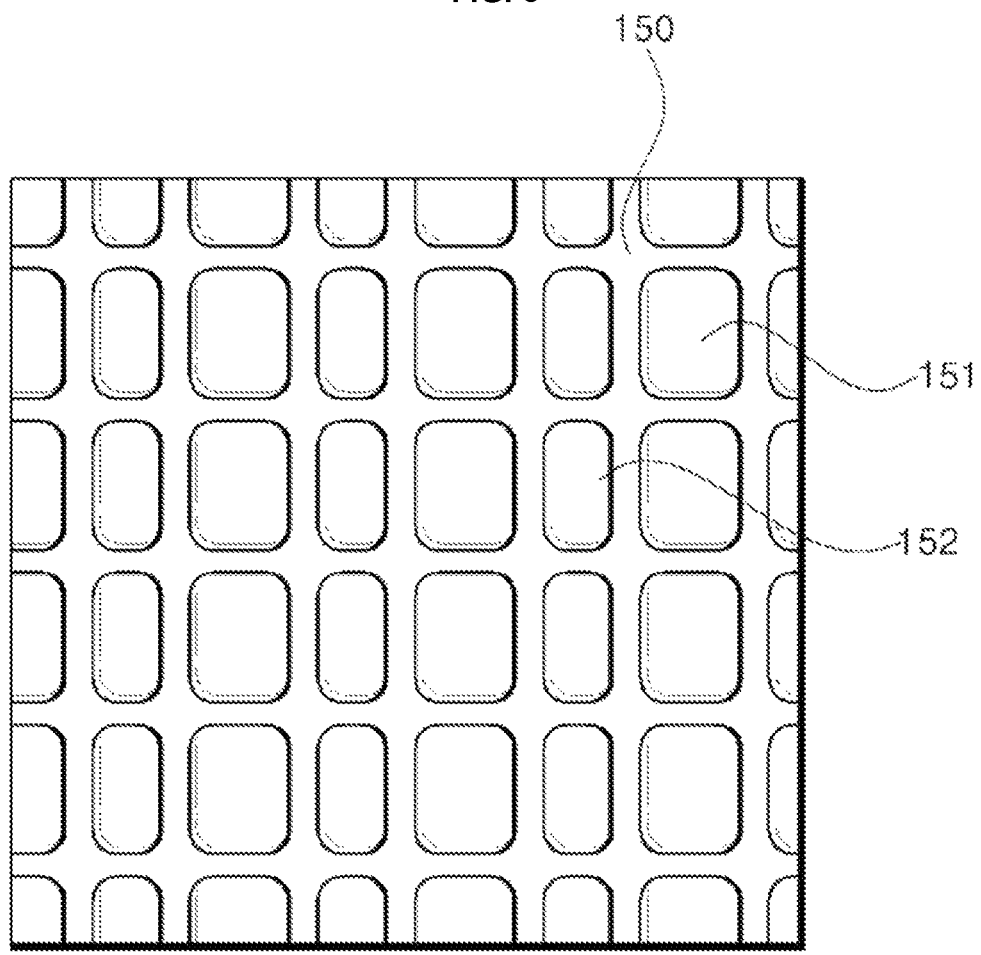
FIG. 3 is a view showing an implementation sample of a heat-dissipation pattern in accordance with an embodiment of the present invention.

In addition, in the case of the second substrate 150, as illustrated in FIG. 3, heat-dissipation patterns 151 and 152, i.e., concave-convex patterns, may be formed on a surface of the second substrate to maximize the heat-dissipation properties of the second substrate, by which more efficient heat-dissipation properties may be obtained even removing a heat sink included in a conventional configuration. In this case, the heat-dissipation pattern may be formed on either side or both sides of the second substrate. In particular, in the case that the heat-dissipation pattern is formed on a side in contact with the first semiconductor element and the second semiconductor element, the heat-dissipation properties and junction characteristics between the thermoelectric element and the substrate can be improved. The shape of the heat-dissipation pattern is not limited to that shown in FIG. 3, but may be modified in various shapes and structures.

Further, a thickness a1 of the first substrate 140 is formed to be smaller than a thickness a2 of the second substrate 150 to facilitate inflow of heat from the cold side so that the heat transfer rate may be improved.

In addition, the dielectric layers 170a and 170b may use a material having a thermal conductivity of 5 to 10 W/K as a dielectric material having a high heat-dissipation performance in consideration of the thermal conductivity of the thermoelectric module for cooling and a thickness may be formed in the range of 0.01 mm to 0.1 mm.

The electrode layers 160a and 160b electrically connect the first semiconductor element and the second semiconductor element using electrode materials such as Cu, Ag, Ni, or the like, and form electrical connections with adjacent unit cells in the case that a multiple number of unit cells as illustrated are connected (see FIG. 2). The thickness of the electrode layer may be formed in a range of 0.01 mm to 0.3 mm.

Hereinafter, various types of the thermoelectric elements capable of applying to the thermoelectric module in accordance with the embodiment of the present invention will be described.

Semiconductor Element Formed in a Bulk-Type

The first semiconductor element 120 and the second semiconductor element 130 according to the present invention may be applied as a semiconductor element which is formed in a bulk-type to which a material of a P-type semiconductor or an N-type semiconductor is applied. The bulk-type refers to a structure formed by pulverizing an ingot as a semiconductor material, a process of fine ball milling the pulverized ingot, and cutting a sintered structure. The bulk-type device may be formed as a unitary integral structure.

In the material of the P-type semiconductor or the N-type semiconductor, the N-type semiconductor may be formed using a bismuth telluride based (BiTe based) main ingredient material including selenium (Se), nickel (Ni), aluminum (Al), copper (Cu), silver (Ag), lead (Pb), boron (B), gallium (Ga), tellurium (Te), bismuth (Bi), or indium (In), and a mixture in which Bi or Te corresponding to 0.001 to 1.0 wt % of the total weight of the main ingredient material is mixed. In other words, the main ingredient material is Bi—Se—Te material, and here, Bi or Te corresponding to 0.001 to 1.0 wt % of the total weight of the Bi—Se—Te is further added. That is, when the weight of Bi—Se—Te of 100 g is added, it is preferable that Bi or Te to be additionally mixed be added in the range of 0.001 g to 1.0 g. As described above, the weight range of the material added to the main ingredient material is significant in that improvement of a ZT value cannot be expected outside the range of 0.001 wt % to 0.1 wt % as the thermal conductivity is not lowered while electrical conductivity drops.

The P-type semiconductor material may be preferably formed using a bismuth telluride based (BiTe based) main ingredient material including antimony (Sb), nickel (Ni), aluminum (Al), copper (Cu), silver (Ag), lead (Pb), boron (B), gallium (Ga), tellurium (Te), bismuth (Bi), or indium (In), and a mixture in which Bi or Te corresponding to 0.001 to 1.0 wt % of the total weight of the main ingredient material is mixed. In other words, the main ingredient material is Bi—Sb—Te material, and here Bi or Te corresponding to 0.001 to 1.0 wt % of the total weight of the Bi—Sb—Te is further added. That is, when the weight of Bi—Sb—Te of 100 g is added, it is preferable that Bi or Te to be additionally mixed be added in the range of 0.001 g to 1 g. As described above, the weight range of the material added to the main ingredient material is significant in that improvement of the ZT value cannot be expected outside the range of 0.001 wt % to 0.1 wt % as the thermal conductivity is not lowered while electrical conductivity drops.

Unit Thermoelectric Element in a Stacked-Type Structure

According to another embodiment of the present invention, a structure of a semiconductor element may be implemented by a structure of a stacked-type instead of the bulk-type structure, which may further improve thinning and cooling efficiency.

Specifically, a structure of the first semiconductor element 120 and the second semiconductor element 130 in FIG. 1 may be cut after being formed as a multiple stacked structure of a unit member in which a sheet type base material is coated with a semiconductor material, thereby material loss can be prevented and electrical conductivity characteristics can be improved.

Figure 4:
FIGS. 4 and 5 are views illustrating an embodiment of a thermoelectric element included in the thermoelectric module in accordance with the embodiment of the present invention.
Figure 4:
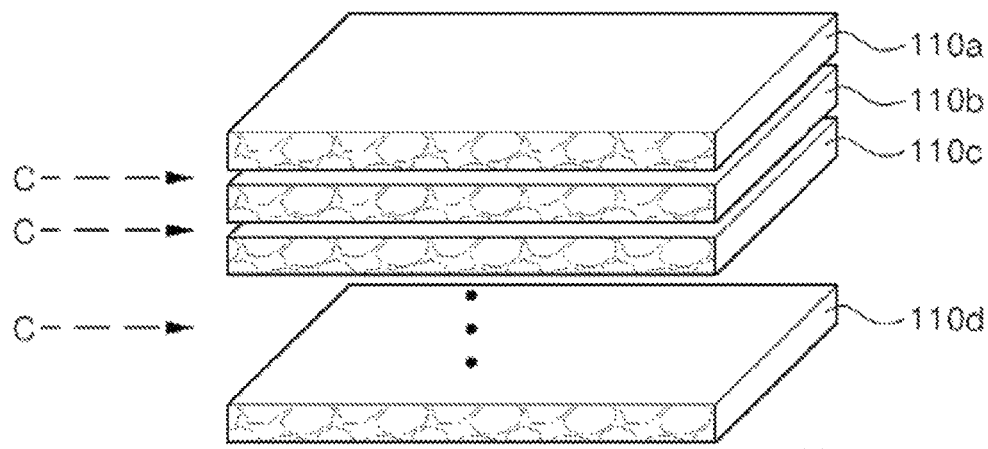
Figure 4:
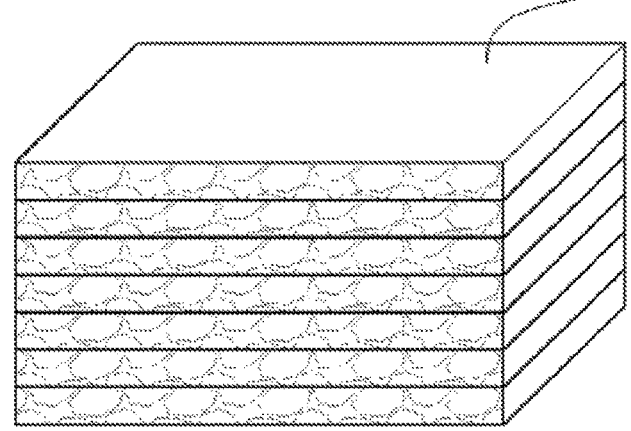

Regarding this, referring to FIG. 4, FIG. 4 illustrates a conceptual diagram of a process of manufacturing the unit member in the stacked structure described above. Referring to FIG. 4, a material including semiconductor material is manufactured as a form of paste, and the paste is coated on a base material 111 such as a sheet, a film, or the like to form a semiconductor layer 112, thereby forming one unit member 110. As illustrated in FIG. 2, the unit member 110 is used to stack a multiple number of unit members 100*a*, 100*b*, and 100*c* to form a stacked structure, which is then cut to form a unit thermoelectric element 120. That is, the unit thermoelectric element 120 according to the embodiment of the present invention may be formed as the multi-stacked structure of the unit member 110 in which the semiconductor layer 112 is stacked on the base material 111.

In the above-described process, the process of coating the semiconductor paste on the base material 111 may be implemented using various methods. As an example, it may be implemented by a tape casting process which includes manufacturing a slurry by mixing ultra-fine powder of a semiconductor material with an aqueous or non-aqueous solvent and any one selected from a binder, a plasticizer, a dispersant, a defoamer, and a surfactant, and then being formed to have an even thickness as desired by a moving blade or on a moving base of a carrier. In this case, a material, such as a film, a sheet or the like with a thickness in the range of 10 um to 100 um, may be used as the base material, and the P-type material and the N-type material used for manufacturing the bulk-type element described above may be applied to the semiconductor material being coated as a matter of course.

A process of stacking and aligning the unit members 110 as multiple layers may form the stacked structure by a compressing the unit members at a temperature of 50° C. to 250° C., and the number of the unit members 110 to be stacked according to the embodiment of the present invention may be in the range of 2 to 50. Then, a process of cutting in a shape and a size as desired may be made, and a sintering process may be added.

The unit thermoelectric element formed by the multiple stacking of the unit member 110 according to the above described process may ensure uniformity in a thickness and a shape size. That is, a conventional thermoelectric element of the bulk-type has problems such as large material loss during the cutting process, difficulty in cutting to an even size, and difficulty in implementing thinning due to a thickness of about 3 mm to 5 mm because of such processes of ingot pulverization, a fine ball-mill process, and then cutting a sintered bulk structure, whereas the unit thermoelectric element in a stacked structure in accordance with the embodiment of the present invention can ensure uniformity of the element as well as little loss of material because the stacked sheet is cut after stacking multiple layers of the unit member in a sheet shape, and thus the thinning of the unit thermoelectric element to a total thickness less than or equal to 1.5 mm can be implemented, and various shapes can be applied.

In particular, in the process of manufacturing the unit thermoelectric element in accordance with the embodiment of the present invention, in the process of forming the stacked structure of the unit member 110, a process of forming a conductive layer on each surface of the unit members 110 may be further included and implemented.

Figure 6:
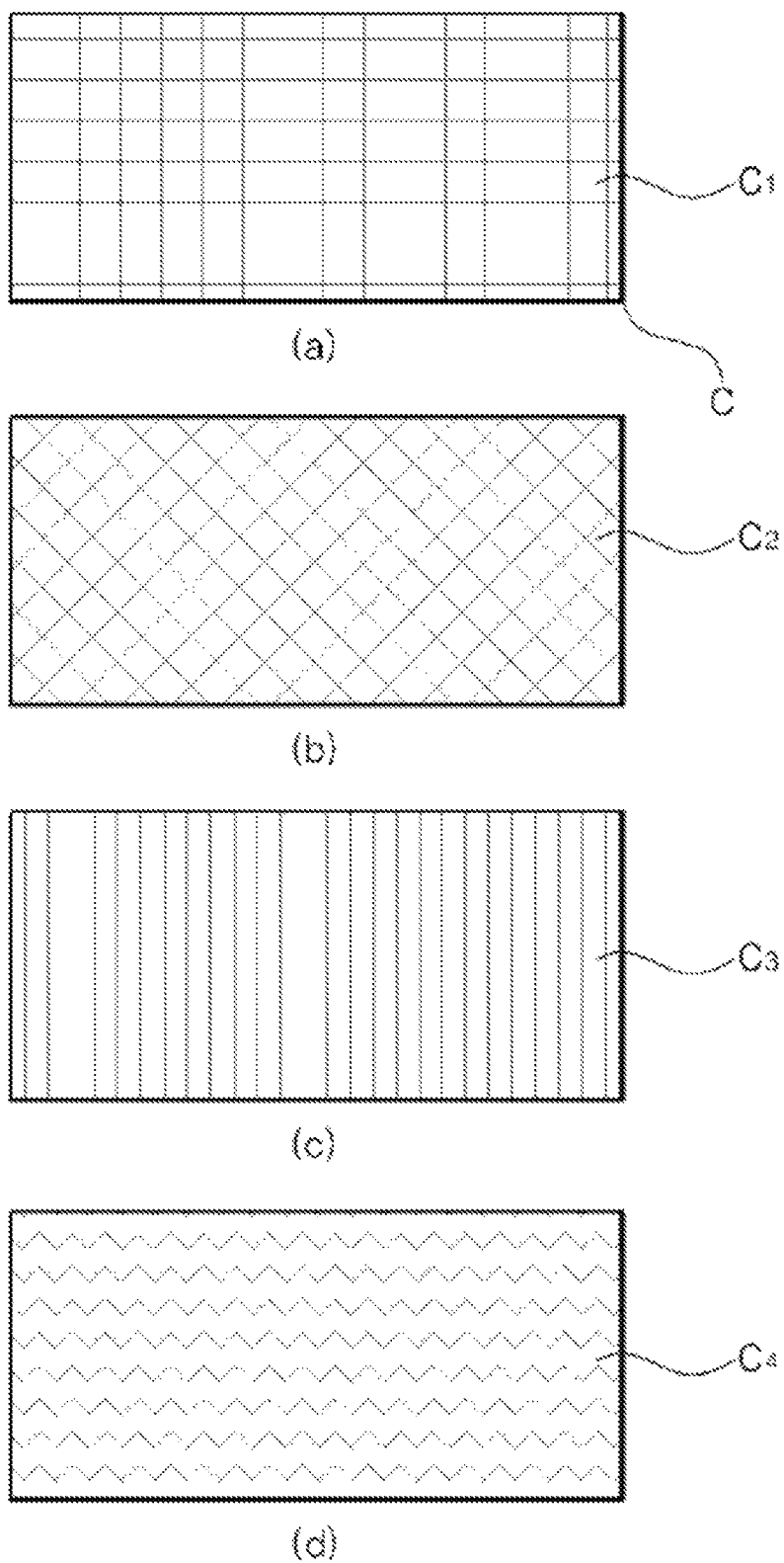
FIG. 6 is a view illustrating various modified samples of a conductive layer C in accordance with an embodiment of the present invention.

That is, a conductive layer such as a structure of FIG. 6 may be formed in between each unit member of the stacked structure in FIG. 4(*c*). The conductive layer may be formed on a surface opposite the base material surface on which the semiconductor layer is formed, and in this case, the conductive layer may be formed as a patterned layer so that a region in which a surface of the unit member is exposed is formed. This may allow a simultaneous increase in electric conductivity and bonding strength between each of the unit members, and implement an advantage of lowering a thermal conductivity as compared with a case in which an entire front surface is coated. That is, various modification examples of a conductive layer C according to the embodiment of the present invention are shown in FIG. 6, where a pattern by which the surfaces of the unit members are exposed is referred to as a mesh-type structure that includes closed-type opening patterns C1 and C2 as shown in FIGS. 6(*a*) and 6(*b*), a line-type structure that includes open-type opening patterns C3 and C4 as shown in FIGS. 6(*c*) and 6(*d*), or the like, and various modifications may be designed. Inside the unit thermoelectric element formed as the stacked structure of the unit member, the conductive layer described as above not only increases bonding strength between the unit members but also lowers thermal conductivity between the unit members, and enables implementing the advantage of improving electric conductivity. In addition, a cooling capacity Qc and a temperature change rate ΔT are improved, and particularly a power factor increases by 1.5 times, that is, the electric conductivity increases by 1.5 times. An increase in the electric conductivity is directly related to the improvement of the thermoelectric efficiency, thereby improving the cooling efficiency. The conductive layer may be formed of a metallic material, and an electrode material of the metal-based material such as Cu, Ag, Ni, and the like may be applied thereto.

In the case that the unit thermoelectric element in the stacked structure shown in FIG. 4 is applied to the thermoelectric module illustrated in FIGS. 1 and 2, that is, when the thermoelectric element in accordance with the embodiment of the present invention is disposed between the first substrate 140 and the second substrate 150 to implement a thermoelectric module as a unit cell structure including the electrode layer and the dielectric layer, it is possible to form a total thickness Th in the range of 1. mm to 1.5 mm, and thus significant thinning can be realized compared with the case of using a conventional bulk-type element.

Figure 5:
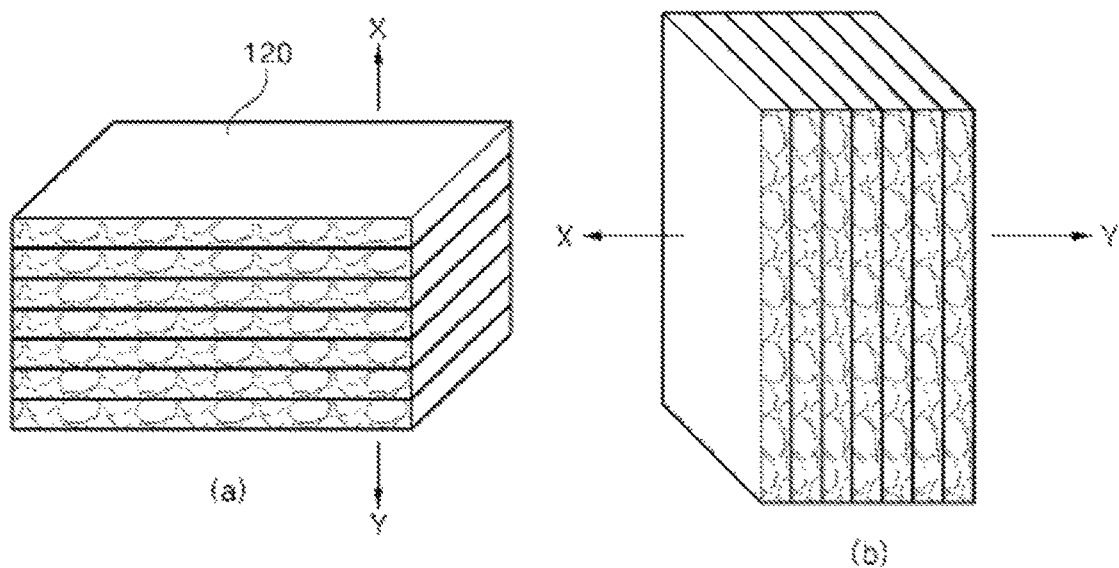

In addition, as shown in FIG. 5, the thermoelectric elements 120 and 130 described above in FIG. 4, as shown in FIG. 5(a), may be horizontally disposed in an upward direction X and a downward direction Y, which may form the thermoelectric module in a structure in which the first substrate and the second substrate are disposed adjacent to surfaces of the semiconductor layer and the base material. Alternatively, as shown in FIG. 5(b), it is also possible for the thermoelectric element itself to be vertically set such that a side surface portion of the thermoelectric element may be disposed adjacent to the first substrate and the second substrate. In such a structure, an end portion of the conductive layer is exposed more at the side surface portion than the structure of the horizontal configuration, which simultaneously improves electric conductivity as well as lowers an efficiency of the thermal conductivity, and thus the cooling efficiency can be further enhanced.

As described above, in the thermoelectric element being applied to the thermoelectric module which is implementable in various embodiments, the first semiconductor element and the second semiconductor element facing each other to form a unit cell may be formed in the same shape and size, and by considering different electric conductivity characteristics between the P-type semiconductor element and the N-type semiconductor element that act as a hindering factor against cooling efficiency, it is possible to form a volume of one semiconductor element to be different from the volume of the other semiconductor element facing each other to improve the cooling performance. That is, the forming of the volumes of the semiconductor elements disposed facing each other in the unit cell to be different may be implemented by methods, on the whole, of forming an entire shape to be different, forming a diameter of a cross section at any one element to be wider in the semiconductor elements having the same height, or forming a height or a diameter of the cross section to be different in the semiconductor elements having the same shape. Particularly, forming a diameter of the N-type semiconductor element to be wider than that of the P-type semiconductor to increase the volume may improve the thermoelectric efficiency.

Various structures of the thermoelectric element and the thermoelectric module including the same described above according to the embodiment of the present invention may implement cooling by taking heat away from a medium such as water, liquid, or the like according to a characteristics of a heat-dissipation portion and a heat-absorption portion on surfaces of an upper substrate and a lower substrate in the unit cell, or may be used for the purpose of transferring heat to a specific medium. That is, in the thermoelectric module according to various embodiments of the present invention, a configuration of the cooling device that enhances cooling efficiency is taken as an embodiment for description, whereas the substrate of an opposite surface on which cooling is performed can be applied as a device for heating a medium using the heat-dissipation characteristics. In other words, the present invention can be applied to a device capable of implementing both functions of heating and cooling simultaneously in an apparatus.

The detailed description of the present invention as described above has been described with reference to certain preferred embodiments thereof. However, various modifications may be made in the embodiments without departing from the scope of the present invention. The inventive concept of the present invention is not limited to the embodiments described above, but should be defined by the claims and equivalent scope thereof.

INDUSTRIAL APPLICABILITY

Various structures of a thermoelectric element and a thermoelectric module including the same as described above according to an embodiment of the present invention can implement cooling by taking heat away from a medium such as water, liquid, or the like according to the characteristics of the heat-dissipation portion and the heat-absorption portion on the surfaces of the upper substrate and the lower substrate in the unit cell, or can be used for the purpose of transferring heat to a specific medium.

The invention claimed is:

1. A thermoelectric module comprising:
   a first substrate and a second substrate configured to face each other; and
   at least one unit cell including a first semiconductor element and a second semiconductor element which are electrically connected and interposed between the first substrate and the second substrate,
   wherein volumes of the first substrate and the second substrate are different from each other, wherein an area of the second substrate is greater than an area of the first substrate, wherein a thickness of the first substrate is smaller than a thickness of the second substrate, wherein the second substrate is a heat-dissipation region, wherein the first substrate and the second substrate are metallic substrates, wherein at least one of the first semiconductor element or the second semiconductor element includes:
   two or more unit members that are stacked on each other, each unit member of the two or more stacked unit members including a base material and a semiconductor layer on the base material; and
   a conductive layer between adjacent unit members,
   wherein each unit member of the two or more stacked unit members is provided parallel to the first substrate and the second substrate.

2. The thermoelectric module of claim 1, further comprising heat-dissipation patterns which are concave-convex patterns formed on one surface of the second substrate.

3. The thermoelectric module of claim 2, wherein the heat-dissipation patterns are disposed on a surface in contact with the first semiconductor element and the second semiconductor element.

4. The thermoelectric module of claim 1, wherein an area ratio of the first substrate and the second substrate is in the range of 1:1.2 to 5.

5. The thermoelectric module of claim 1, wherein the conductive layer includes a pattern by which a surface of each of the unit members is exposed.

6. The thermoelectric module of claim 5, wherein the pattern is a mesh-type structure including a closed-type opening pattern or a line-type structure including an open-type opening pattern.

7. The thermoelectric module of claim 5, wherein the conductive layer is a pattern layer implemented by a metallic material.

8. The thermoelectric module of claim 1, further comprising electrode layers on the first substrate and the second substrate.

9. The thermoelectric module of claim 8, further comprising dielectric layers between the first substrate and the electrode substrate and between the second substrate and the electrode substrate.

10. The thermoelectric module of claim 8, wherein heights of the first semiconductor element and the second semiconductor element are in a range of 0.01 mm to 0.5 mm.

11. The thermoelectric module of claim 1, wherein the first semiconductor element and the second semiconductor element are a mixture in which Bi or Te is mixed to a BiTe based main ingredient material.

12. A heat conversion apparatus comprising:
a thermoelectric module,
wherein the thermoelectric module includes:
   a first substrate and a second substrate configured to face each other; and
   at least one unit cell including a first semiconductor element and a second semiconductor element which are electrically connected and interposed between the first substrate and the second substrate,
wherein volumes of the first substrate and the second substrate are different from each other, wherein an area of the second substrate is greater than an area of the first substrate, wherein a thickness of the first substrate is smaller than a thickness of the second substrate, wherein the second substrate is a heat-dissipation region, wherein the first substrate and the second substrate are metallic substrates, wherein at least one of the first semiconductor element or the second semiconductor element includes:
two or more unit members that are stacked on each other, each unit member of the two or more stacked unit members including a base material and a semiconductor layer on the base material; and
a conductive layer between adjacent unit members,
wherein each unit member of the two or more stacked unit members is provided parallel to the first substrate and the second substrate.

* * * * *